United States Patent
Moran et al.

(10) Patent No.: US 9,785,508 B2
(45) Date of Patent: Oct. 10, 2017

(54) METHOD AND APPARATUS FOR CONFIGURING I/O CELLS OF A SIGNAL PROCESSING IC DEVICE INTO A SAFE STATE

(71) Applicants: Robert F. Moran, Largs (GB); Alan Devine, Paisley (GB); Alistair Paul Robertson, Glasgow (GB)

(72) Inventors: Robert F. Moran, Largs (GB); Alan Devine, Paisley (GB); Alistair Paul Robertson, Glasgow (GB)

(73) Assignee: NXP USA, Inc., Austin, TX (US)

( * ) Notice: Subject to any disclaimer, the term of this patent is extended or adjusted under 35 U.S.C. 154(b) by 248 days.

(21) Appl. No.: 14/482,387

(22) Filed: Sep. 10, 2014

(65) Prior Publication Data
US 2016/0070619 A1  Mar. 10, 2016

(51) Int. Cl.
*G06F 11/00* (2006.01)
*G06F 11/14* (2006.01)
*G01R 31/3185* (2006.01)

(52) U.S. Cl.
CPC ...... *G06F 11/1415* (2013.01); *G01R 31/3185* (2013.01); *G01R 31/318544* (2013.01); *G06F 2201/805* (2013.01)

(58) Field of Classification Search
CPC ............. G06F 11/1415; G06F 11/0751; G01R 31/3177; G01R 31/333
See application file for complete search history.

(56) References Cited

U.S. PATENT DOCUMENTS

| | | | |
|---|---|---|---|
| 5,479,652 A | 12/1995 | Dreyer et al. | |
| 5,935,266 A | 8/1999 | Thurnhofer et al. | |
| 6,903,453 B2 | 6/2005 | Nishibata et al. | |
| 7,533,315 B2 * | 5/2009 | Han | G06F 11/3656 703/13 |
| 2005/0243491 A1 * | 11/2005 | Tanis | H02H 3/00 361/104 |
| 2006/0036879 A1 * | 2/2006 | Wahler | G06F 1/206 713/300 |
| 2008/0052576 A1 * | 2/2008 | Brandyberry | G06F 11/2242 714/727 |
| 2010/0159408 A1 * | 6/2010 | Beilfuss | F23N 5/242 431/66 |
| 2011/0121751 A1 * | 5/2011 | Harrison | H05B 33/0815 315/291 |

* cited by examiner

*Primary Examiner* — Bryce Bonzo
*Assistant Examiner* — Jonathan Gibson

(57) ABSTRACT

A peripheral integrated circuit (IC) device for providing support to a data processing IC device. The peripheral IC device comprises a fault detection component arranged to detect an occurrence of fault conditions within the data processing IC device. The peripheral IC device further comprises a safe state control component. Upon detection of a fault condition occurring within the data processing IC device by the fault detection component, the safe state control component is arranged to cause at least one I/O cell of the data processing IC device to be configured into at least one scan-chain, and cause at least one predefined control signal to be scanned into the at least one scan-chain to configure the at least one I/O cell into a state corresponding to the predefined control signal.

20 Claims, 6 Drawing Sheets

METHOD AND APPARATUS FOR CONFIGURING I/O CELLS OF A SIGNAL PROCESSING IC DEVICE INTO A SAFE STATE

FIELD OF THE INVENTION

This invention relates to configuring input/output (I/O) cells of a data processing IC device into a safe state, and more specifically to a peripheral integrated circuit device, a data processing integrated circuit device, and a data processing system suitable for such applications.

BACKGROUND OF THE INVENTION

In safety critical applications such as automotive applications and industrial applications, if a fault occurs within a controller unit, for example comprising a microcontroller or the like, it is often critical that a safety level is maintained on input/output (I/O) signals of the controller unit to avoid external circuitry from being held in a potentially damaging state, for example a high side driver being held in an always-on state that could cause damage to a load being driven.

SUMMARY OF THE INVENTION

The present invention provides a peripheral integrated circuit device, a data processing integrated circuit device, a data processing system as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Figure 1:
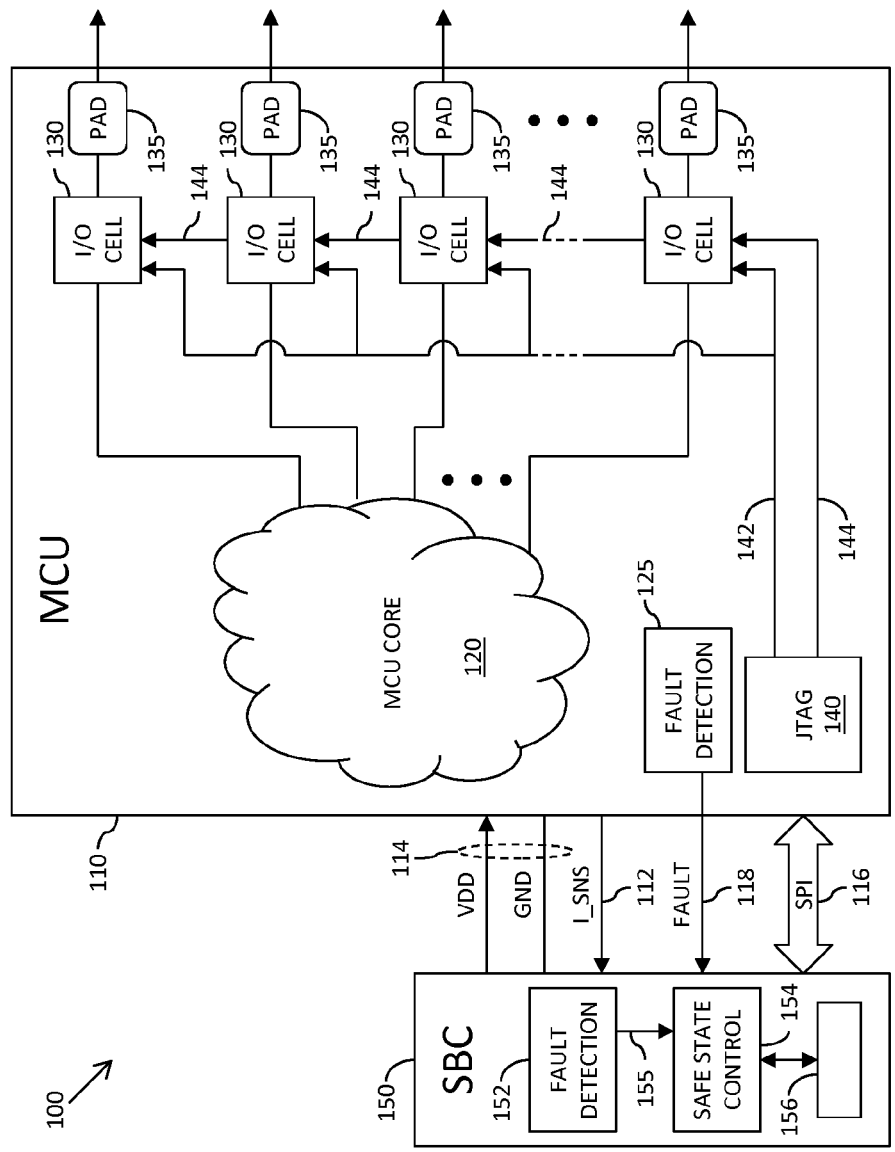
FIGS. 1 and 3 to 5 illustrated simplified block diagrams of an example of a data processing system.

The present invention will now be described with reference to the accompanying drawings, and in particular with reference to an example of a data processing system comprising a microcontroller and a power management integrated circuit device, such as of the type referred to as system basis chip, which are power management IC's in which a plurality of functions necessary for the realization of an electronic module are combined, such as voltage regulator, voltage monitor, reset generator, (Window) Watchdog, Bus interface (CAN-Bus, LIN Bus, etc.), wakeup logic and power driver. However, it will be appreciated that the present invention is not limited to the specific examples herein described and illustrated in the accompanying drawings. For example, parts of the present invention are not limited to being implemented within power management integrated circuit devices, and may equally be implemented within alternative forms of peripheral integrated circuit devices for providing support to data processing integrated circuit devices. Furthermore, parts of the present invention are not limited to being implemented within microcontrollers, and may equally be implemented within alternative forms of data processing integrated circuit devices such as, say, other types of microprocessors for example general purpose microprocessors, network processors, digital signal processor (DSP).

Furthermore, because the illustrated embodiments of the present invention may for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

According to examples, there is provided a peripheral integrated circuit (IC) device for providing support to at least one data processing IC device. The peripheral IC device comprises at least one fault detection component arranged to detect an occurrence of at least one fault condition within the at least one data processing IC device. The peripheral IC device further comprises at least one safe state control component arranged to, upon detection of at least one fault condition occurring within the at least one data processing IC device by the at least one fault detection component:

cause at least one input/output, I/O, cell of the at least one data processing IC device to be configured into at least one scan-chain; and cause at least one predefined control signal to be scanned into the at least one scan-chain to configure the at least one I/O cell into a state corresponding to the predefined control signal.

In this manner, the peripheral IC device may be arranged to force the I/O cells of the data processing IC device into predefined safety levels upon detection of certain (predefined) fault conditions. Advantageously, by providing such safety within a peripheral IC device, an addition level of isolation from the data processing IC device is provided in the event of a fault condition occurring within the data processing IC device itself. As such, the potential for the detected fault within the data processing IC device affecting the ability to implement the safety level is to a large extent circumvented. Furthermore, providing such within the peripheral IC device enables such safety to be provided to data processing IC devices that do not have any internal safety features of their own.

In some examples, the peripheral IC device may be arranged to be operably coupled to the at least one data processing IC device via a serial peripheral interface, and the at least one safe state control component may be arranged to transmit command signals to the at least one data processing IC device to cause the at least one I/O cell of the at least one data processing IC device to be configured into at least one scan-chain and to cause the at least one predefined control signal to be scanned into the at least one scan-chain via the serial peripheral interface.

In some examples, the at least one safe state control component may be arranged to cause the at least one I/O cell of the at least one data processing IC device to be configured into at least one scan-chain by sending at least one command signal to at least one debug component of the at least one data processing IC device instructing the debug component to configure the at least one I/O cell of the at least one data processing IC device into at least one scan-chain.

In some examples, the at least one safe state control component may be arranged to cause at least one predefined control signal to be scanned into the at least one scan-chain by sending at least one command signal to the at least one debug component of the at least one data processing IC device comprising at least one control signal pattern to cause the at least one debug component to scan in at least one control signal into the at least one scan-chain to configure the at least one I/O cell to comprise at least one logical level corresponding to the at least one control signal pattern.

In some examples, the at least one safe state control component may be arranged to cause at least one predefined control signal to be scanned into the at least one scan-chain by sending at least one command signal to the at least one debug component of the at least one data processing IC device to cause the at least one debug component to scan in at least one control signal into the at least one scan-chain to configure the at least one I/O cell to comprise a high input impedance.

In some examples, the at least one safe state control component may be arranged to cause at least one predefined control signal to be scanned into the at least one scan-chain by sending at least one command signal to the at least one debug component of the at least one data processing IC device to cause the at least one debug component to scan in at least one control signal into the at least one scan-chain to configure the at least one I/O cell to comprise at least one logical level corresponding to at least one predefined control signal pattern.

In some examples, the at least one safe state control component may be arranged to send command signals to the at least one debug component conforming to or emulating messages conforming to one of the IEEE1149 and IEEE1149.7 JTAG standards.

In some examples, the at least one safe state control component may be operably coupled to at least one memory element and arranged to read therefrom at least one series of command signals for causing the at least one I/O cell of the at least one data processing IC device to be configured into at least one scan-chain and for causing at least one predefined control signal to be scanned into the at least one scan-chain to configure the at least one I/O cell into to a state corresponding to the predefined control signal.

In some examples, the at least one safe state control component may be further arranged to read from the at least one memory element the at least one control signal to be scanned into the at least one scan-chain.

In some examples, the at least one memory element may be arranged to be accessible by the at least one data processing IC device to enable the at least one data processing IC device to configure at least one of the at least one series of command signals and the at least one control signal stored therein.

In some examples, the at least one safe state control component may be operably coupled to at least one fuse element configurable to define the at least one control signal to be scanned into the at least one scan-chain.

In some examples, the at least one control signal to be scanned into the at least one scan-chain may be hardcoded into the peripheral IC device.

In some examples, the at least one predefined control signal to be scanned into the at least one scan-chain may be arranged to force the at least one I/O cell into to a state comprising at least one of:
a high logical level;
a low logical level; and
a high input impedance level.

In some examples, the at least one fault detection component may be arranged to detect the occurrence of at least one of:
an over-current condition within the data processing IC device;
an over-voltage condition within the data processing IC device;
an over-temperature condition within the data processing IC device; and
a watchdog function not being serviced.

In some examples, the at least one fault detection component may be arranged to detect the occurrence of fault conditions based on a notification received from the data processing IC device of the detection of a fault condition thereby.

In some examples, the peripheral IC device may comprise circuitry which provides to the at least one data processing IC device at least one from a group comprising at least one of: power regulator; over current detection; watchdog; and physical layer communication.

In some examples, the peripheral IC device may comprise a power management module.

According to some examples, there is provided a data processing IC device comprising at least one safety level configuration component, the at least one safety level configuration component being controllable by at least one peripheral IC device to:
configure at least one input/output, I/O, cell of the at least on data processing IC device to be configured into at least one scan-chain; and
cause at least one predefined control signal to be scanned into the at least one scan-chain to configure the at least one I/O cell into to a state corresponding to the predefined control signal.

In some examples, the at least one I/O cell may be arranged to be isolated from core functional components of the data processing IC device when configured into the at least one scan-chain by the at least one safety level configuration component.

In some examples, the at least one safety level configuration component may comprise at least one debug component of the data processing IC device.

In some examples, the at least one scan-chain may comprise at least one boundary scan scan-chain.

In some examples, the data processing IC device may comprise one of:
a System-on-Chip IC device;
a microcontroller IC device;
a microprocessor IC device; and
digital signal processor IC device.

According to some examples, there is provided a data processing system comprising at least one data processing integrated circuit device and at least one peripheral integrated circuit device for providing support to the at least one data processing integrated circuit device.

Referring now to FIG. 1, there is illustrated a simplified block diagram of an example of a data processing system 100. The data processing system 100 comprises a data processing integrated circuit (IC) device 110, which in the illustrated example comprises a microprocessor, more specific a microcontroller (MCU) IC device. The MCU IC device 110 comprises MCU core 120 comprising circuitry and logic for providing the core fabric of the MCU IC device 110. Such MCU core may comprise, say, one or more processor cores, one or more on-chip, volatile and/or non-volatile, memory elements, one or more interconnects (e.g. bus, crossover switch, etc.) components, and any other on-chip components of the MCU IC device 110 provided for the specific application of the MCU IC device 110.

The MCU IC device 110 further comprises a plurality of input/output (I/O) cells 130 to which the MCU core 120 is operably coupled during normal operation of the MCU IC device 110. Each I/O cell 130 comprises an I/O node operably coupled to an I/O pad 135 of the MCU IC device 110, with each I/O pad 135 being arranged to provide an external connection to one or more external components (not shown) of the data processing system 100. During normal operation of the MCU IC device 110, each I/O cell 130 may be controlled by the MCU core 120 to drive a high or low voltage at the respective I/O pad 135 in order to drive a required output signal, and (at other times) to apply a high input impedance to the respective I/O pad 135 and to detect and convey to the MCU core 120 an input signal received at the respective I/O pad 135. Such I/O cells 130 are well known in the art, and as such specific features of the I/O cells 130 need not be described in any further detail.

The data processing system 100 further comprises a peripheral IC device 150 arranged to provide support to the MCU IC device 110. In the illustrated example, the peripheral IC device 150 comprises a power management (SBC). The SBC 150 may be arranged to provide various different forms of support to the MCU IC device 110 such as, by way of example only, power regulation, over current detection, watchdog, physical layer communication, etc. Power managements are well known in the art, and as such specific features of the SBC 150 need not be described in any further detail.

In the illustrated example, the SBC 150 is operably coupled to the MCU IC device 110 via a serial peripheral interface (SR) 116, as well as by way of one or more power supply lines 114, a current sense signal line 112 and a fault condition detection signal 118. Other connections and/or signal may also be provided between the MCU IC device 110 and the SBC 150. Furthermore, it will be appreciated that the various connections and signals between the MCU IC device 110 and the SBC 150 of the illustrated examples are only exemplary and are not essential features of the present invention.

In the illustrated example, the SBC 150 comprises a fault detection component 152 arranged to detect the occurrence of at least one fault condition within the MCU IC device 110. For example, the fault detection component 152 may be arranged to detect the occurrence of, say, one or more of:
  an over-current condition within the MCU IC device 110, for example based on one or more current sense signals 112 received from the MCU IC device 110;
  an over-voltage condition within the MCU IC device 110, for example based on detected voltage levels on voltage supply signals 114 there between;
  an over-temperature condition with the MCU IC device 110, for example based on a received temperature indication received from the MCU IC device 110 (e.g. via the SPI connection 116) or from an external temperature sensor (not shown); and/or
  a watchdog for the MCU IC device 110 not being served, for example such a watchdog being provided by the SBC 150 and serviced via the SPI connection 116 or being provided within the MCU IC device 110 itself and an indication of the watchdog not being service being provided by the MCU IC device 110 to the fault detection component 152 via the SPI connection 116.

In some examples, the fault detection component 152 may be arranged to detect the occurrence of fault conditions based on a notification received from MCU IC 110 device 110 of the detection of a fault condition thereby. For example, and as illustrated in FIG. 1, the MCU IC 110 may comprise a fault detection unit 125 arranged to notify the fault detection component 152 of the SBC 150 when a fault is detected via a dedicated fault detection signal 118 between the MCU IC device 110 and the SBC 150. In the illustrated example, the fault detection component 152 is arranged to output a fault detected signal 155 indicating that a fault condition has been detected upon detection of the occurrence of a fault condition within the MCU IC device 110. The fault detected signal 155 may further comprise an indication of the type of fault detected.

The SBC 150 further comprises a safe state control component 154. In the illustrated example, the safe state control component 154 is arranged to receive the fault detected signal 155, and upon the fault detected signal 155 indicating that a fault condition has been detected within the MCU IC device 110, the safe state control component 154 is arranged to cause (at least some of) the I/O cells 130 of the MCU IC device 110 to be configured into one or more scan-chain(s), and predefined control signals to be scanned into the one or more scan-chains comprising the I/O cells 130 to configure the I/O cells 130 into states corresponding to the predefined control signals. For example, upon the detection of the occurrence of a fault condition within the MCU IC device 110 being indicated by the fault detected signal 155, the safe state control component 154 may be arranged to transmit command signals to the MCU IC device 110 via the SPI connection 116 to cause the I/O cells 130 to be configured into the scan-chain(s) and to cause the predefined control signals to be scanned into the scan-chains.

In particular, it is contemplated that the predefined control signals scanned into the scan-chain(s) are arranged to configure the I/O cells 130 into safety levels to avoid external circuitry from being held in a potentially damaging state as a result of the detected fault condition. For example, a command signal for an I/O cell 130 that is arranged to output a drive signal for, say, a high side driver may be configured to force the I/O cell 130 to output a drive signal to maintain the high side drive in an off state. In this manner, the SBC 150 may be arranged to force the I/O cells 130 of the MCU IC device 110 into predefined safety levels upon detection of certain (predefined) fault conditions. Advantageously, by providing such safety within a peripheral IC device such as the SBC 150 illustrated in FIG. 1, an addition level of isolation from the MCU IC device 110 is provided in the event of a fault condition occurring within the MCU IC device 110 itself. As such, the potential for the detected fault within the MCU IC device 110 affecting the ability to implement the safety level is to a large extent circumvented. Furthermore, providing such within the peripheral IC device enables such safety to be provided to data processing IC devices that do not have any internal safety features of their own. According to some examples of the present invention, it is contemplated that the predefined control signals scanned into the scan-chain(s) may be arranged to configure the I/O cell(s) 130 into safety levels comprising, for example, one or more of:
  a high logical level (e.g. comprising a high voltage level at the I/O node thereof);

a low logical level (e.g. comprising a low voltage level at the I/O node thereof); and/or a high input impedance level.

In some examples, such as illustrated in FIG. 1, the safe state control component 154 may be operably coupled to one or more memory elements 156, and arranged to read therefrom one or more command signals for causing the I/O cells 130 to be configured into one or more scan-chain(s) and for causing one or more predefined control signal(s) to be scanned into the scan-chain(s) to configure the I/O cells 130 into safety levels corresponding to the predefined control signal(s). The command signal(s) read from memory may then be transmitted to the MCU IC device 110 via the SPI connection 116. The safe state control component 154 may further be arranged to read one or more predefined control signal pattern(s) comprising control signals to be scanned into the scan-chain(s) from the memory element(s) 156, and to transmit the read control signal patterns to the MCU IC device 110 via the SPI connection 116. Such memory element(s) 156 may comprise, say, one or more registers and/or RAM memory into which the respective command signal(s) and/or control signal pattern(s) may be loaded upon power up of the data processing system 100, for example by the MCU IC device 110. Where the memory element(s) 156 comprise such volatile memory, the command signals and/or predefined control signal patterns may be loaded into the memory element(s) upon boot/power up of the data processing system 100. Additionally/alternatively such memory element(s) 156 may comprise non-volatile memory such as Flash memory. In other examples of the present invention, the command signals and/or predefined control signal patterns may be hardcoded into the SBC 150, or fuse elements may be used to store the values.

In some examples, the safe state control component 154 may be arranged to communicate with the MCU IC device 110 using IEEE1149 (JTAG 5-wire) standard signals or IEEE1149.7 (CJTAG 2-wire) standard signals, and may be arranged to cause (at least some of) the I/O cells 130 of the MCU IC device 110 to be configured into one or more scan-chain(s) by placing the MCU IC device 110 into a boundary scan mode. For example, and as illustrated in FIG. 1, upon the fault detected signal 155 indicating that a fault condition has been detected within the MCU IC device 110, the safe state control component 154 may be arranged to send one or more JTAG/CJTAG command signal(s) to a debug component of the MCU IC device 110, such as the JTAG controller 140, instructing the JTAG controller 140 to configure the I/O cells 130 into one or more boundary scan-chain(s). The safe state control component 154 may then send one or more JTAG/CJTAG command signal(s) to the JTAG controller 140 of the MCU IC device 110 comprising one or more control signals pattern(s) to be scanned into the boundary scan-chains to configure the I/O cells 130 into states corresponding to the predefined control signals. Alternatively, the safe state control component 154 may send one or more JTAG/CJTAG command signal(s) to the JTAG controller 140 of the MCU IC device 110 instructing the JTAG controller 140 to scan in one or more preconfigured (within the MCU IC device 110) control signal pattern(s) into the boundary scan-chain(s).

Examples of JTAG commands that may be used to configure the JTAG controller 140 into a boundary scan mode and to scan in predefined control signal values may comprise:

PRELOAD instruction, along with associated 'safety level' control signal values;

HIGH-Z instruction to force associated I/O cells to a high impedance level;

EXTEST instruction to force associated I/O cells to preloaded 'safety level' values; and BYPASS instruction, which may be used for I/O cells that are to be excluded/bypassed.

In some examples, it is contemplated that such JTAG/CJTAG command signals may be emulated over conventional SPI ports within a signal basis chip or the like. This would avoid the need to add a JTAG controller to the SBC 150, and thus reduce costs etc. Such JTAG emulation may be implemented in various ways. For example, such JTAG emulation may be implemented such that no intervention is required from the MCU IC device 110 to establish a JTAG link. This may be achieved by, for example, operably coupling the SPI connection 116 to SPI and JTAG pins (not shown) on the MCU IC device 110, and sharing the same chip select (CS) signal. For such an implementation there is potential for the JTAG signals to impact on the MCU SPI port (not shown), depending on the particular application and fault. Alternatively, the SPI connection 116 may be operably coupled to SPI and JTAG pins (not shown) on the MCU IC device 110, with a dedicated CS signal for each of the SPI port (not shown) and a JTAG port 140 of the MCU IC device 110 (e.g. CS0 for SPI and CS1 for JTAG). This would require an additional (chip select) pin on each of the SBC 150 and the MCU IC device 110, but would avoid the issue of JTAG signals impacting on the MCU SPI port (not shown).

JTAG emulation may alternatively be implemented with intervention from the MCU IC device 110 to establish a JTAG link. This may be achieved by, for example, the SPI connection 116 being operably coupled to SPI and JTAG pins (not shown) on the MCU IC device 110, and upon a fault being detected the MCU IC device 110 may be arranged to switch the SPI pins thereof to a high impedance level. This would avoid the JTAG signals passing into the MCU SPI port (not shown). Alternatively, the MCU IC device 110 could internally multiplex the SPI and JTAG ports over the same pins. On detection of a fault, the MCU IC device 110 could configure the internal multiplexer(s) to switch coupling the SPI connection 116 from the SPI port (not shown) of the MCU IC device 110 to the JTAG port 140 of the MCU IC device 110.

In other examples, the SBC 150 may comprise a dedicated JTAG controller or CJTAG controller (not shown), or a simplified version thereof. For example, CJTAG (2-wire) signals could be multiplexed on the SBC 150 over the SPI connection 116, for example over Clk and Data pins (not shown) of the SPI connection 116. These signals within the SPI connection 116 may be operably coupled to both SPI and CJTAG ports on the MCU IC device 110. On a detection of a fault, the SBC 150 multiplexer (not shown) may be switched to the CJTAG mode to operably couple the CJTAG signals to the Clk and Data pins of the SPI connection 116. Such an implementation may avoid the SPI port (not shown) on the MCU IC device 110 latching data by configuring the SPI CS signal to be non-asserted.

Alternatively, such a dedicated JTAG/CJTAG controller may be provided with dedicated pins on the SBC 150 and MCU IC device 110.

The MCU IC device 110 comprises a safety level configuration component controllable by the SBC 150 (e.g. via command signals received via, for example, the SPI connection 116) to configure the I/O cells 130 to be configured into one or more scan-chains, and to cause one or more predefined control signal(s) to be scanned into the scan-chain(s) to configure the I/O cells 130 into one or more state(s) corresponding to the predefined control signal(s). In the illustrated example the safety level configuration component of the MCU IC device 110 is implemented by way of the JTAG controller 140, which is arranged to output one or more scan-chain configuration signal(s) 142 with which the JTAG controller 140 is able to configure the I/O cells of the MCU IC device 110 into one or more scan-chain(s). The JTAG controller 140 in the illustrated example is further arranged to scan in control signal patterns to the one or more scan-chain(s), via one or more scan-in signal line(s) 144.

Figure 2:
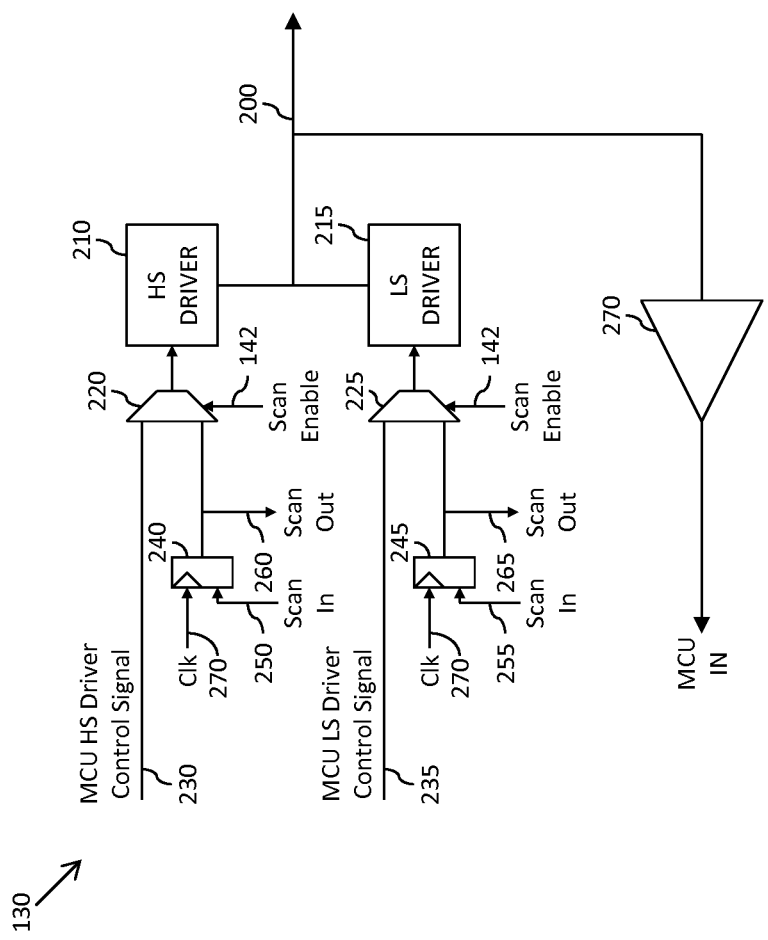
FIG. 2 illustrates a simplified clock diagram of an example of an input/output (I/O) cell.

FIG. 2 illustrates a simplified clock diagram of an example of an I/O cell 130. In the illustrated example, the I/O cell 130 comprises an I/O node 200 arranged to be operably coupled to an I/O pad 135 (FIG. 1) of the MCU IC device 110.

The I/O cell 130 further comprises a high side driver component 210 controllable to operably couple the I/O node 200 to a high voltage supply in order to apply a high logical level to the I/O node 200. In the illustrated example, an output of a first multiplexer component 220 is operably coupled to an input of the high side driver component 210. A first input of the first multiplexer component 220 is arranged to receive a high side driver control signal 230 from the MCU core 120. A second input of the first multiplexer component 230 is operably coupled to an output of a first scan-chain latch 240. A scan enable signal provided by way of the scan-chain configuration signal(s) 142 is arranged to control the first multiplexer component 220 to operably couple one of the high side driver control signal 230 from the MCU core 120 and the output of the first scan-chain latch 240 to the input of the high side driver component 210. In the manner, during normal operation of the MCU IC device 110, the scan enable signal 142 provided to the I/O cell 130 may be configured to control the first multiplexer component 220 to operably coupled the high side driver control signal 230 from the MCU core 120 to the input of the high side driver component 210. Conversely, when the I/O cell 130 is required to be configured into a scan-chain (e.g. upon detection of a fault condition by the SBC 150), the scan enable signal 142 may be configured to control the first multiplexer component 220 to operably couple the output of the first scan-chain latch 240 to the input of the high side driver component 210.

An input of the first scan-chain latch 240 is arranged to receive a scan-in value 250, such as may be output by a corresponding scan-chain latch 240 within an immediately preceding I/O cell 130 of the scan-chain, or if the I/O cell 130 is the first I/O cell within the scan-chain from, say, the debug controller 140 by way of the scan-in signal line(s) 144. The output of the first scan-chain latch 240 is also arranged to provide a scan-out value 260 to be provided to the input of a corresponding scan-chain latch of an immediately following I/O cell 130 of the scan-chain. The first scan-chain latch 240 is arranged to apply a logical value (e.g. a '1' or '0') present at its input to its output upon each active edge (e.g. rising and/or falling edge) of a clock signal 270 received thereby. In this manner, the corresponding scan-chain latches 240 within a scan-chain are arranged to sequentially pass values (e.g. a control signal pattern) along the chain upon each active edge of the clock signal.

The I/O cell 130 further comprises a low side driver component 215 controllable to operably couple the I/O node 205 to a low voltage supply in order to apply a low logical level to the I/O node 205. In the illustrated example, an output of a second multiplexer component 225 is operably coupled to an input of the low side driver component 215. A first input of the second multiplexer component 225 is arranged to receive a low side driver control signal 235 from the MCU core 120. A second input of the second multiplexer component 235 is operably coupled to an output of a second scan-chain latch 245. A scan enable signal provided by way of the scan-chain configuration signal(s) 142 is arranged to control the second multiplexer component 225 to operably couple one of the low side driver control signal 235 from the MCU core 120 and the output of the second scan-chain latch 245 to the input of the low side driver component 215. In the manner, during normal operation of the MCU IC device 110, the scan enable signal 142 provided to the I/O cell 130 may be configured to control the second multiplexer component 225 to operably coupled the low side driver control signal 235 from the MCU core 120 to the input of the low side driver component 215. Conversely, when the I/O cell 130 is required to be configured into a scan-chain (e.g. upon detection of a fault condition by the SBC 150), the scan enable signal 142 may be configured to control the second multiplexer component 225 to operably couple the output of the second scan-chain latch 245 to the input of the low side driver component 215.

An input of the second scan-chain latch 245 is arranged to receive a scan-in value 255, such as may be output by a corresponding scan-chain latch 245 within an immediately preceding I/O cell 130 of the scan-chain, or if the I/O cell 130 is the second I/O cell within the scan-chain from, say, the debug controller 140 by way of the scan-in signal line(s) 144. The output of the second scan-chain latch 245 is also arranged to provide a scan-out value 265 to be provided to the input of a corresponding scan-chain latch of an immediately following I/O cell 130 of the scan-chain. The second scan-chain latch 245 is arranged to apply a logical value (e.g. a '1' or '0') present at its input to its output upon each active edge (e.g. rising and/or falling edge) of a clock signal 270 received thereby. In this manner, the corresponding scan-chain latches 245 within a scan-chain are arranged to sequentially pass values (e.g. a control signal pattern) along the chain upon each active edge of the clock signal.

For completeness, the I/O cell 130 further comprises an input buffer 270. An input of the input buffer 270 is operably coupled to the I/O node 200 of the I/O cell. An output of the input buffer 270 is arranged to provide a digital representation of the voltage level at the I/O node 200, for example representing a signal from an external component operably coupled thereto. The I/O cell 130 may be arranged to drive a logical high state at the I/O node 200 thereof by controlling the high side driver component 210 to comprise an 'on' state whereby the high side driver operably couples the I/O node 200 to the high voltage supply (not shown), and controlling the low side driver component 215 to comprise an 'off' state whereby the low side driver decouples the I/O node 200 from the low voltage supply (not shown). The I/O cell 130 may further be arranged to comprise a high input impedance at the I/O node 200 thereof by controlling the high side driver component 210 to comprise an 'off' state whereby the high side driver operably decouples the I/O node 200 from the high voltage supply (not shown), and controlling the low side driver component 215 to also comprise an 'off' state whereby the low side driver decouples the I/O node 200 from the low voltage supply (not shown).

In the example illustrated in FIG. 1, the use of the multiplexer components 220, 225 to selectively couple the input of the driver components 210, 215 to either driver control signals 230, 235 from the MCU core 120 or the outputs of the scan-chain latches 240, 245 enables the I/O cells 130 to be effectively isolated from the MCU core 120 when the I/O cell 130 is configured into a scan-chain. In this manner, a detected fault condition within the MCU may be prevented from adversely affecting the state of the I/O cell 130. Furthermore, by isolating the I/O cells 310 from the MCU core 120 in this manner when a fault condition is detected within the MCU IC device 110, the I/O cells 130 can be forced into and held in safety levels (by being configured into scan-chains and having safety level control signal scanned in), whilst allowing the MCU core 120 to remain functional in order to provide a mechanism for recovery or logging of the fault condition. For example, the MCU 120 may perform a cyclic redundancy check (CRC) of memory, repair of flash memory, a security check, log faults into EEPROM, etc.

Figure 3:
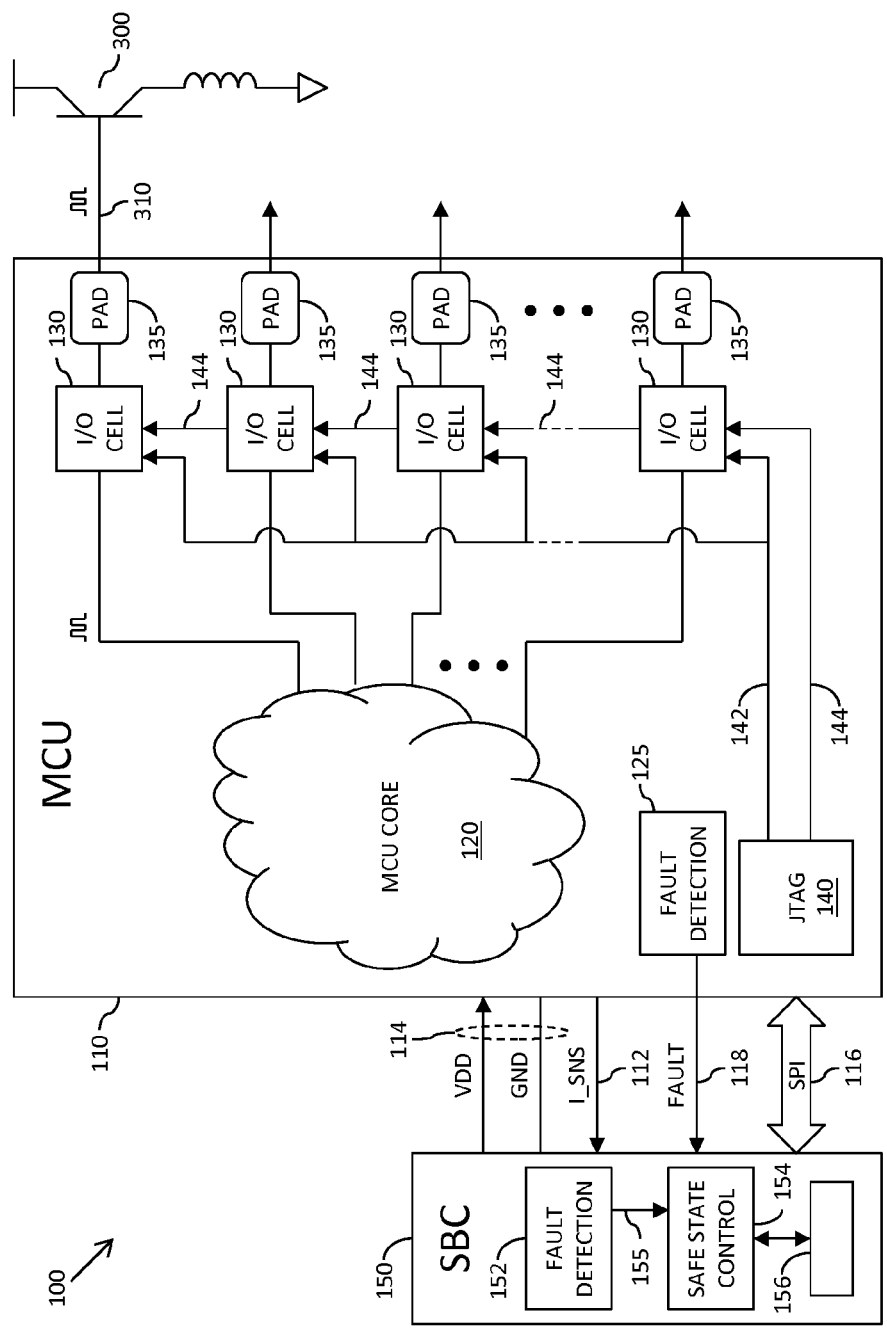

Referring now to FIG. 3, there is illustrated an example of the data processing system 100 of FIG. 1 during normal (e.g. fault-free) operation. In the example illustrated in FIG. 3, one of the I/O cells is arranged to provide a control signal 310 to a high side driver 300. During a drive phase for the high side driver 300, the MCU core fabric 120 is arranged to control the I/O cell 130 to drive a pulse width modulated (PWM) control signal 310 for the high side driver 300.

Figure 4:
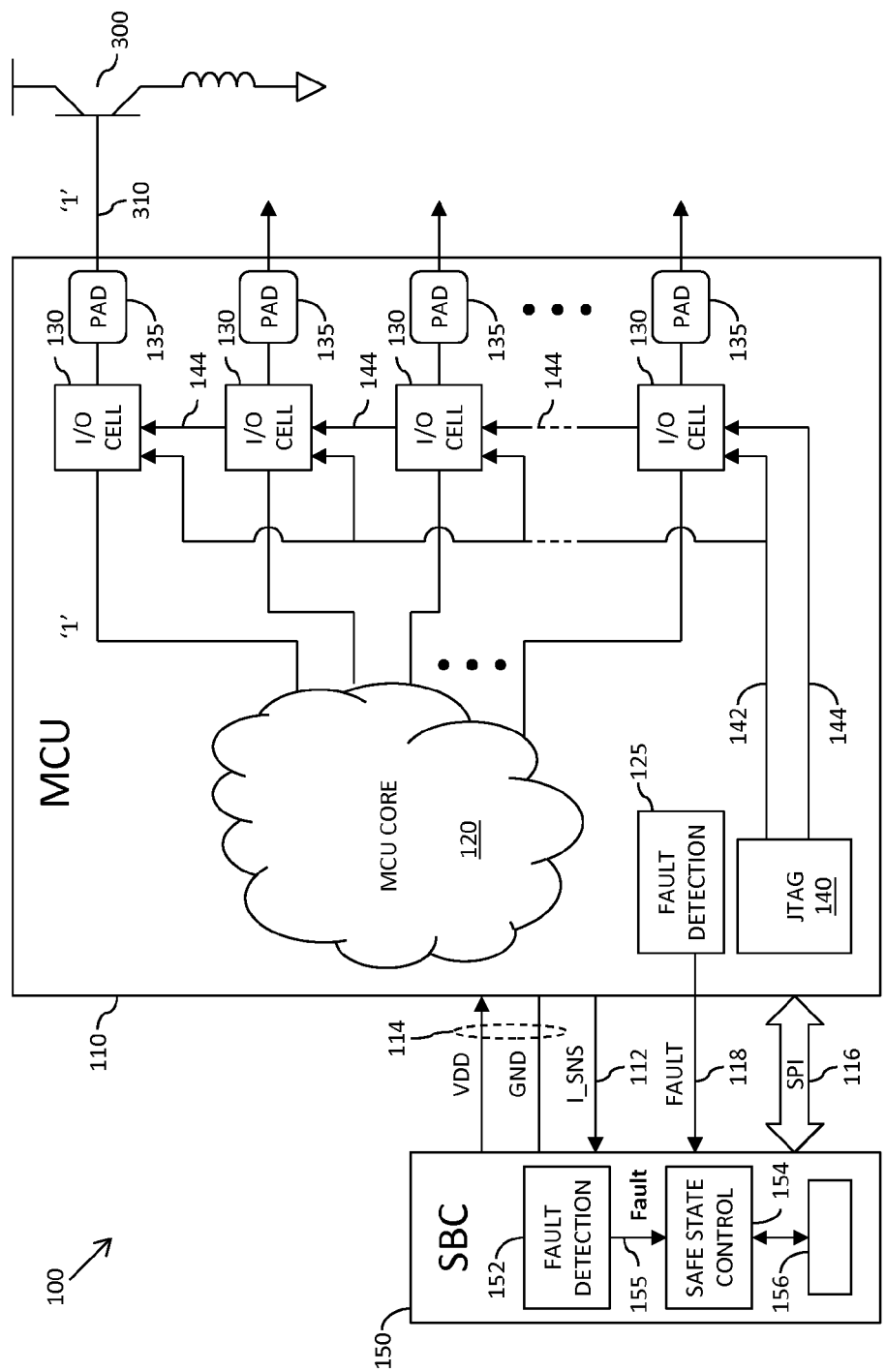

Referring now to FIG. 4, there is illustrated an example of the data processing system 100 of FIG. 1 upon a fault condition being detected within the MCU IC device 110. In the illustrated example, the detected fault condition has resulted in the MCU core fabric 120 of the MCU IC device 110 causing the I/O cell 130 to hold the high side driver 300 in an always-on state which could cause damage to a load being driven if maintained for a prolonged period of time. As described above, the fault detection component 152 of the SBC 150 is arranged to detect the occurrence of fault conditions within the MCU IC device 110, and to output a fault detected signal 155 indicating that a fault condition has been detected. The safe state control component 154 of the SBC 150 is arranged to receive the fault detected signal 155, and upon the fault detected signal 155 indicating that a fault condition has been detected within the MCU IC device 110, to cause (at least some of) the I/O cells 130 of the MCU IC device 110 to be configured into one or more scan-chain(s), and predefined control signals to be scanned into the one or more scan-chains to configure the I/O cells 130 into states corresponding to the predefined control signals. For example, the safe state control component 154 may be arranged to read an appropriate series of JTAG commands from the memory element(s) 156 and to transmit the JTAG commands to the JTAG controller 140 to cause the JTAG controller 140 to configure the I/O cells into one or more scan-chains using the scan-chain configuration signal(s) 142, and to scan in to the scan-chain(s) control signal pattern(s). Such control signal patterns may be provide by the safe state control component 154, or may be obtained separately by the JTAG controller 140.

Figure 5:
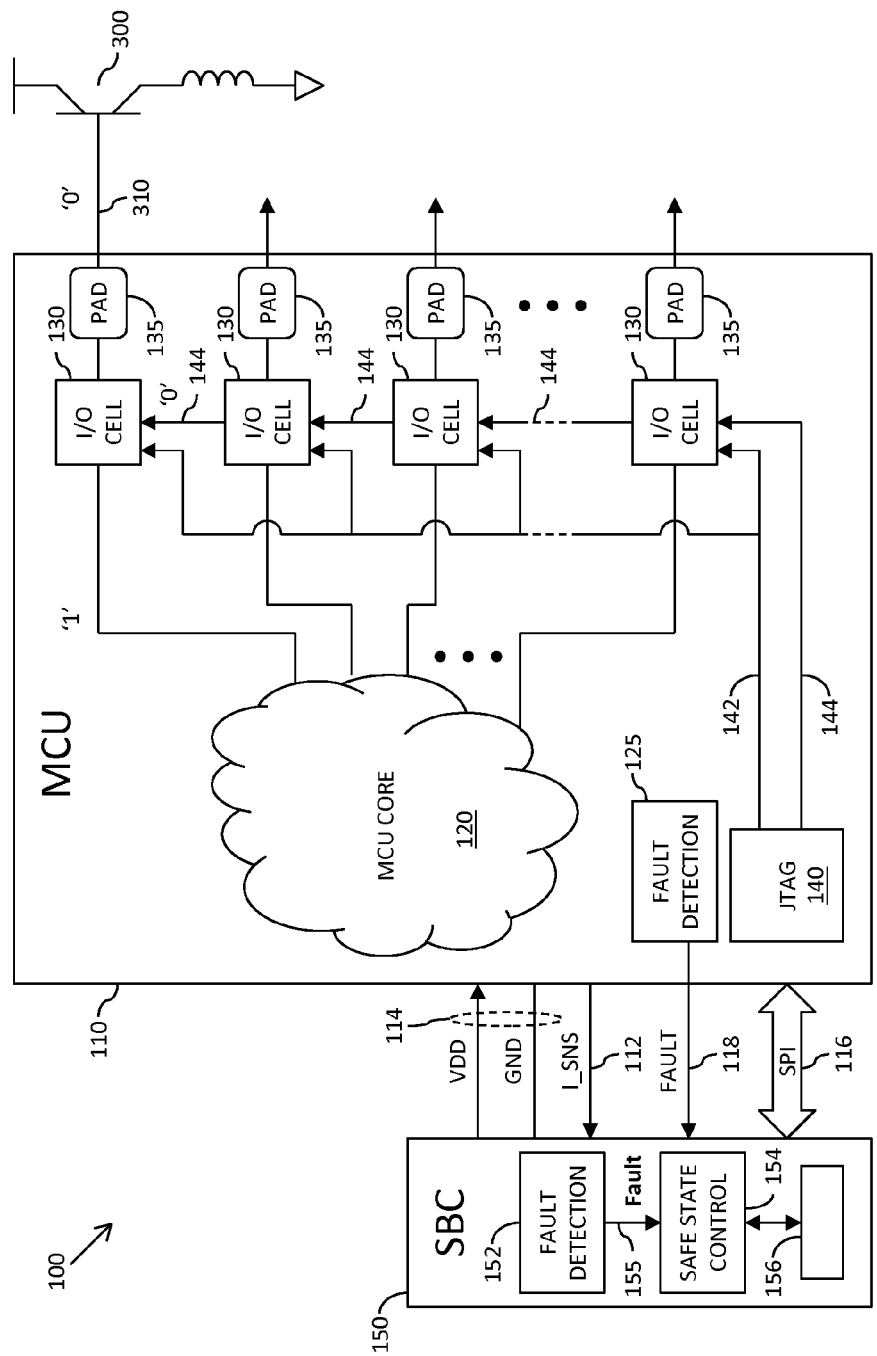

It is contemplated that the control signals scanned into the scan-chains are predefined such that, once the scanning in of the control signal pattern(s) has been completed the I/O cells are forced into safety levels, depending on their particular use within the data processing system 100. For example, and as illustrated in FIG. 5, in the case of the I/O cell 310 arranged to provide a control signal 310 to a high side driver 300, the control signal for said I/O cell scanned into the scan-chain may be predefined to force the I/O cell 310 into a low logical level, such that the I/O cell 310 drives a low voltage control signal 310 for the high side driver 300. In this manner, the high side driver 300 is held in an always-off state upon detection of a fault condition within the MCU IC device 110, preventing damage being caused to a load being driven.

Advantageously, the reaction to a detected fault condition and the time required to force the I/O cells into safety levels is determined by the length and speed of the scan-chains. For example, configuring two hundred I/O cells 310 into a single scan-chain and scanning in a control signal pattern for all two hundred I/O cells 310 could be performed within less than 10 us using conventional JTAG command signals and an SPI connection 116 at 25 MHz. Such a time scale is a sufficiently fast reaction time to avoid catastrophic damage to most external loads. It will be appreciated that in some examples, all I/O cells 310 of the MCU IC device 110 may be configurable into a single boundary scan-chain. Alternatively, the I/O cells 310 may be grouped into multiple boundary scan-chains, thereby enabling the time required to scan-in control signal patterns, and thus the reaction time, to be reduced.

As previously mentioned, in some examples boundary scan technology may be used to implement the present invention. Since boundary scan technology is often already implemented within MCU/MPU IC devices for debug purposes, such debug capacity may be reused during run-time, minimising the additional cost and area requirements within such MCU/MPU IC devices to implement the present invention.

Figure 6:
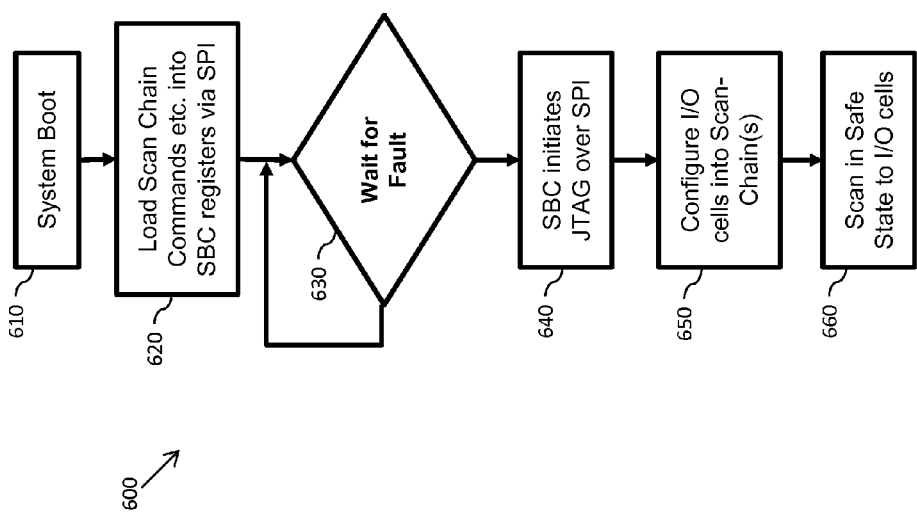
FIG. 6 illustrates a simplified flowchart of an example of a method of configuring I/O cells of a data processing IC device into a safe state.

Referring now to FIG. 6, there is illustrated a simplified flowchart 600 of an example of a method of configuring I/O cells of a data processing IC device into a safe state, such as may be implemented (at least partly) within the SBC 150 of FIGS. 1 and 3 to 5 for configuring I/O cells 130 of the MCU IC device 110 into a safe state. The method starts at 610 with, in the illustrated example, a system boot. Next, at 620, a series of scan-chain commands and, in some examples, one or more control signal patterns are loaded into registers of the peripheral IC device (e.g. the memory element 156 of the SBC 150) via an SPI connection. The method then waits for a fault condition within the data processing IC device, for example the MCU IC device 110, to be detected, at 630. Upon detection of a fault condition within the data processing device, the method moves on to 640 where, in the illustrated example, the peripheral IC device initiates JTAG signalling over the SPI connection, and then sends commands previously loaded into the registers of the peripheral IC device over the SPI connection to, say, a JTAG controller of the signalling processing IC device to cause I/O cells thereof to be configured into one or more scan-chain(s), at 650. One or more control signal pattern(s) is/are then scanned into the scan-chains, at 660. Such control signal pattern(s) may have previously been loaded into the registers of the peripheral IC device, and retrieved and transmitted over the SPI connection to the JTAG controller of the data processing IC device. In this manner, by defining appropriate control signals to be scanned into the scan-chain(s) comprising the I/O cells of the data processing IC device in this manner, the I/O cells may be configured into safe states.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms 'assert' or 'set' and 'negate' (or 'de-assert' or 'clear') are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition upon various logic blocks or circuit elements. Thus, it is to be understood that the architectures depicted herein are merely exemplary, and that in fact many other architectures can be implemented which achieve the same functionality. For example, for clarity and ease of understanding the fault detection component 152 and the safe state control component 154 of the SBC 150 have been illustrated as discrete components within the SBC 150. However, it will be appreciated that the fault detection component 152 and the safe state control component 154 may equally be implemented as a single component within the SBC 150.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A peripheral integrated circuit, IC, device for providing support to a data processing IC device, the peripheral IC device comprising:
   a fault detection component arranged to detect an occurrence of a fault condition within the data processing IC device; and
   a safe state control component arranged to, in response to detection of the fault condition occurring within the data processing IC device by the fault detection component:
      cause an input/output, I/O, cell of the data processing IC device to be configured into a scan-chain; and
      cause a predefined control signal to be scanned into the scan-chain to configure the I/O cell into a state corresponding to the predefined control signal.

2. The peripheral IC device of claim 1, wherein the peripheral IC device is arranged to be operably coupled to the data processing IC device via a serial peripheral interface, and the safe state control component is arranged to transmit command signals to the data processing IC device to cause the I/O cell of the data processing IC device to be configured into the scan-chain and to cause the predefined control signal to be scanned into the scan-chain via the serial peripheral interface.

3. The peripheral IC device of claim 1, wherein the safe state control component is arranged to cause the I/O cell of the data processing IC device to be configured into the scan-chain by sending a command signal to a debug component of the data processing IC device instructing the debug component to configure the I/O cell of the data processing IC device into the scan-chain.

4. The peripheral IC device of claim 3, wherein the safe state control component is arranged to cause the predefined control signal to be scanned into the scan-chain by sending the command signal to the debug component of the data processing IC device comprising a control signal pattern to cause the debug component to scan in a control signal into the scan-chain to configure the I/O cell to comprise a logical level corresponding to the control signal pattern.

5. The peripheral IC device of claim 3, wherein the safe state control component is arranged to cause the predefined control signal to be scanned into the scan-chain by sending a command signal to the debug component of the data processing IC device to cause the debug component to scan in a control signal into the scan-chain to configure the I/O cell to comprise a high input impedance.

6. The peripheral IC device of claim 3, wherein the safe state control component is arranged to cause the predefined control signal to be scanned into the scan-chain by sending a command signal to the debug component of the data processing IC device to cause the debug component to scan in a control signal into the scan-chain to configure the I/O cell to comprise a logical level corresponding to a predefined control signal pattern.

7. The peripheral IC device of claim 3, wherein the safe state control component is operably coupled to a memory element and arranged to read therefrom a series of command signals for causing the I/O cell of the data processing IC device to be configured into the scan-chain and for causing a predefined control signal to be scanned into the scan-chain to configure the I/O cell into to a state corresponding to the predefined control signal.

8. The peripheral IC device of claim 7, wherein the safe state control component is further arranged to read from the memory element the control signal to be scanned into the scan-chain.

9. The peripheral IC device of claim 3, wherein the safe state control component is operably coupled to a fuse element configurable to define the control signal to be scanned into the scan-chain.

10. The peripheral IC device of claim 3, wherein the control signal to be scanned into the scan-chain is hardcoded into the peripheral IC device.

11. The peripheral IC device of claim 1, wherein the predefined control signal to be scanned into the scan-chain is arranged to force the I/O cell into to a state comprising at least one of:
 a high logical level;
 a low logical level; and
 a high input impedance level.

12. The peripheral IC device of claim 1, wherein the fault detection component is arranged to detect the occurrence of at least one of:
 an over-current condition within the data processing IC device;
 an over-voltage condition within the data processing IC device;
 an over-temperature condition within the data processing IC device; and
 a watchdog function not being serviced.

13. The peripheral IC device of claim 1, wherein the fault detection component is arranged to detect the occurrence of fault conditions based on a notification received from the data processing IC device of the detection of a fault condition thereby.

14. The peripheral IC device of claim 1, wherein the support provided by the peripheral IC device to the data processing IC device comprises at least one from a group comprising:
 power regulator functionality;
 over current detection functionality;
 watchdog functionality; and
 physical layer communication functionality.

15. A data processing integrated circuit, IC, device comprising a safety level configuration component, the safety level configuration component being controllable by a peripheral IC device operably coupled to the data processing IC device to:
 configure an input/output, I/O, cell of the data processing IC device to be configured into a scan-chain in response to a detection of a fault condition occurring within the data processing IC device; and
 cause a predefined control signal to be scanned into the scan-chain to configure the I/O cell into to a state corresponding to the predefined control signal.

16. The data processing IC device of claim 15, wherein the I/O cell is arranged to be isolated from core functional components of the data processing IC device when configured into the scan-chain by the safety level configuration component.

17. The data processing IC device of claim 15, wherein the safety level configuration component comprises a debug component of the data processing IC device.

18. The data processing IC device of claim 15, wherein the scan-chain comprises at least one boundary scan scan-chain.

19. The data processing IC device of claim 15, wherein the data processing IC device comprises a microprocessor.

20. A method comprising:
 detecting, at a detection component, an occurrence of a fault condition within a data processing integrated circuit, IC, device; and
 in response to detection of the fault condition occurring within the data processing IC device:
  causing, by a safe state control component, an input/output, I/O, cell of the data processing IC device to be configured into a scan-chain; and
  causing, by the safe state control component, a predefined control signal to be scanned into the scan-chain to configure the I/O cell into a state corresponding to the predefined control signal.

* * * * *